United States Patent [19]

Moberg

[11] 4,329,860
[45] May 18, 1982

[54] FRONT ENTRY ELECTRIC METER LOCKING ASSEMBLY

[75] Inventor: Sigurd M. Moberg, Etlan, Va.
[73] Assignee: E. J. Brooks Company, Newark, N.J.
[21] Appl. No.: 139,776
[22] Filed: Apr. 14, 1980
[51] Int. Cl.³ .................... B65D 55/14; F16L 21/06; G01R 11/04
[52] U.S. Cl. ..................................... 70/164; 70/232; 70/DIG. 57; 292/256.67
[58] Field of Search .......... 70/164, 232, 19, DIG. 57; 292/256.67, 256.6, 307 R

[56] References Cited

U.S. PATENT DOCUMENTS

| | | | |
|---|---|---|---|
| 1,057,438 | 4/1913 | Macklin et al. | 292/307 R |
| 3,678,717 | 7/1972 | Eaton | 70/232 |
| 3,782,144 | 1/1974 | Gonyo et al. | 70/164 |
| 3,867,822 | 2/1975 | Morse et al. | 70/232 X |
| 4,008,585 | 2/1977 | Lundberg | 70/232 X |
| 4,080,811 | 3/1978 | Nielsen, Jr. | 70/232 X |
| 4,158,953 | 6/1979 | Nielsen, Jr. | 70/232 X |
| 4,225,165 | 9/1980 | Kesselman | 292/256.67 |
| 4,226,102 | 10/1980 | Mattress, Jr. | 70/164 |

FOREIGN PATENT DOCUMENTS 702996  2/1931  France ................................ 70/232

Primary Examiner—Roy D. Frazier
Assistant Examiner—Carl F. Pietruszka
Attorney, Agent, or Firm—Robert E. Ross

[57] ABSTRACT

A locking cover assembly for the ends of an electric meter retaining ring. The assembly comprises a U-shaped bracket for positioning between the downwardly turned ends of the retaining ring and over the bolt that retains the ends of the ring together. A housing is provided for assembly over the ends of the ring and the depending ends of the U-shaped member, and an opening is provided in the housing and the depending ends of the U-shaped bracket for receiving a bolt type locking member, so that the locking member extends generally perpendicular to the plane of the ring so that the lock may be assembled and dis-assembled from the front of the meter.

5 Claims, 5 Drawing Figures

U.S. Patent May 18, 1982 4,329,860
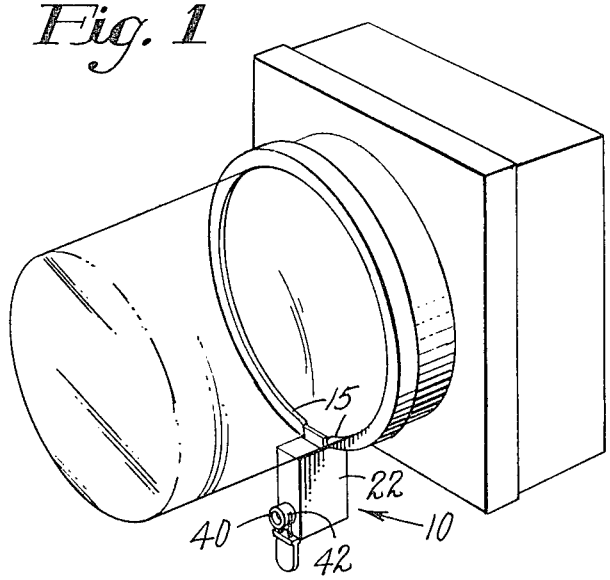
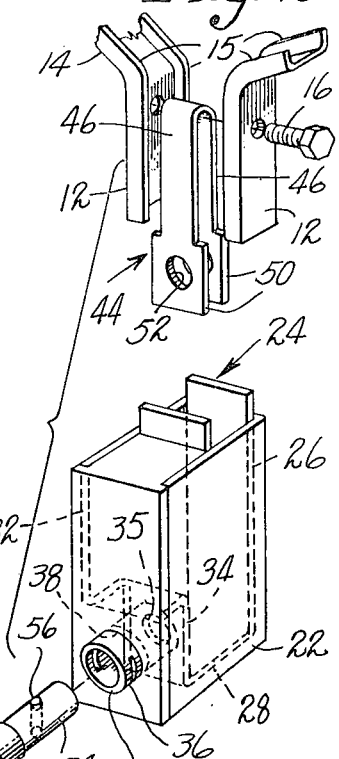
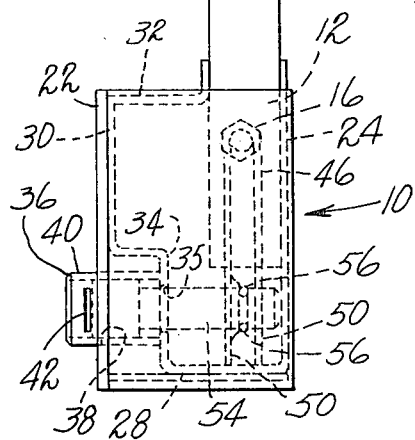
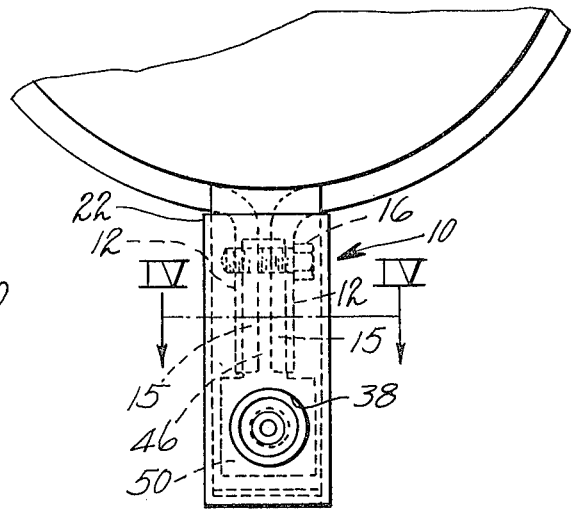

FRONT ENTRY ELECTRIC METER LOCKING ASSEMBLY

BACKGROUND OF THE INVENTION

In a commonly used type of electric meter, the meter housing is retained on the meter socket box by a clamping ring of U-shaped cross-section, which enclose the mounting ring of the meter and a mounting flange on the meter socket box. The ends of the clamping ring are turned radially outwardly (usually to extend downwardly), and a bolt is provided to draw the ends of the ring together to tighten the ring around the meter and base flanges.

Means must be provided for preventing unauthorized persons from loosening the ring to remove the meter to short across the terminals to by-pass the meter.

For example, in U.S. Pat. No. 4,008,585 there is illustrated a form of locking cover which has a side aperture aligned with apertures in the ends of the clamping ring, to receive a locking bolt of the so-called barrel lock type, as shown in U.S. Pat. No. 4,015,456. Although the housing illustrated in said U.S. Pat. No. 4,008,585 has achieved considerable commercial success, there are certain meter installations where it cannot be used because the lock is loaded into the housing from the side. In many meter installations in apartment houses, for example, where there is one meter for each apartment, the meters are often mounted to close together that there is not room enough for the barrel lock and operating key to be positioned between two adjacent meters.

SUMMARY OF THE INVENTION

This invention provides a locking cover assembly for mounting over the ends of a meter locking ring to prevent access by unauthorized persons to the ring clamping bolt that retains the ends of the ring together. A U-shaped bracket is disposed inside the cover, which is disposed over the ring clamping bolt. The front of the cover and the ends of the bracket are provided with aligned apertures to allow assembly of a locking bolt from the front of the housing so that the bolt is disposed generally perpendicular to the plane of the locking ring. In a preferred embodiment of the invention, the ends of the retaining ring have inturned side edges which enclose at least a portion of the legs of the U-shaped bracket.

BRIEF DESCRIPTION OF THE FIGURES OF THE DRAWINGS

FIG. 1 is a perspective view of a meter assembly utilizing the locking housing of the invention.

FIG. 2 is an exploded view of the components of the locking housing, the lock, and the ends of the meter locking ring.

FIG. 3 is a view in front elevation of the assembly of FIG. 1, with the portion inside the housing being shown in dotted line.

FIG. 4 is a view in section taken on line 5—5 of FIG. 4.

FIG. 5 is a view in side elevation of the assembly as shown in FIG. 3.

DESCRIPTION OF THE ILLUSTRATED EMBODIMENT

Referring to the drawing, there is illustrated a protective housing assembly 10 for assembly onto the outwardly turned ends 12 of a clamping ring 14. The ring 14 may be U-shaped in cross-section, having inturned edges 15, for holding a meter onto a meter socket box, as is well known in the art. The ends 12 of the ring are provided with suitable apertures (one of which may be threaded) to receive a clamping screw 16 for tightening the ring.

The housing assembly 10 comprises a housing portion 22 which is generally rectangular in cross-section and open at one end only. Assembled into the housing is a bracket 24 which serves to reinforce the walls of housing and comprises a rear portion 26 disposed against the back wall of the housing, a bottom portion 28 disposed against the bottom of the housing, a front portion 30, the upper end of which is disposed against the front wall of the housing, and upper portion 32 disposed against the top of the housing. The various portions of the bracket 24 may be spot welded or otherwise fastened to the interior surfaces of the housing.

The lower portions 34 of the front portion of the bracket is spaced from the front of the housing and has an opening 35. The portion 34 provides support for the end of a seal adaptor 36 which is a cylinder of metal extending through an opening 38 in the front wall of the housing, abutting the portion 34 of the bracket at the inner end, and has an outer end 40 that protrudes from the front of the housings. Said outer end has slots 42 for receiving a seal.

A U-shaped bracket 44 is provided as part of the assembly which extends over the clamping screw 16 and has upper leg portions 46 disposed between the inturned edges 48 of the ends 12 of the clamping ring, and end portions 50 extending below the ends of the clamping ring. Said end portions 50 each include a plate with an aperture 52 which is aligned with the axis of the seal adaptor to receive a locking bolt 54. The bolt 54 is of the so-called barrel lock type, having a pair of locking balls 56 disposed in retaining apertures near the forward end, and an internal mechanism (not shown), for forcing said balls outwardly to the locking position, as more fully described in above-identified U.S. Pat. No. 4,015,456. The components are so dimensioned that when the lock bolt 54 is inserted into the housing through the seal adaptor, the forward end of the bolt abuts the rear portion 26 of the internal bracket 24, the balls 56 are disposed between the end portions 50 of the legs of the bracket 44, and the head of the lock bolt is disposed in the seal adaptor inwardly of the seal slots 42. When so assembled, the locking bolt is retained in assembly by engagement of the balls 56 behind the end portion of the bracket, and the bracket is retained behind the inturned edges 48 of the ends 12 of the clamping ring. The entire assembly is retained over the ends of the clamping ring by the fact that the U-shaped bracket 44 hangs over the clamping screw 16.

The bolt lock is thereby positioned at a right angle to the plane of the clamping ring, so that the operating tool (not shown) may be inserted into the lock bolt from the front of the meter, allowing use of this type of locking bolt in installations where a number of meters are closely spaced together.

Since changes apparent to one skilled in the art may be made in the herein-illustrated embodiment of the invention without departing from the scope thereof, it is intended that all matter contained herein be interpreted in an illustrative and not a limiting sense.

I claim:

1. Locking means for retaining an electric meter in assembly with a meter mount, comprising a U-section split locking ring assembly including means on the ends of the locking ring to the contract the ring, a housing shielding the contracting means from access, a locking plate having an aperture disposed in the housing and fixed to the locking ring assembly, and a lock bolt extending through the housing and the opening in the locking plate with its axis perpendicular to the plane of the ring and preventing removal of the shielding means.

2. A locking ring assembly for an electric meter comprising a U-section clamping ring assembly having a ring with substantially parallel ends and clamping means on said ends drawing said ends together, a hollow housing disposed over said ends and said clamping means, said hollow housing having an aperture in the front face for receiving a lock bolt in a direction perpendicular to the plane of the ring, and means in the housing attached to the clamping ring assembly having an aperture receiving the front end of the lock bolt in locking engagement, said means being so associated with the clamping ring assembly as to prevent removal of the housing when the lock bolt is in the assembled position.

3. A locking assembly as set out in claim 2 in which said means in the housing receiving the front end of the lock bolt in locking engagement comprises a pair of spaced plates having aligned apertures receiving the front end of the lock bolt, and said lock bolt has radially protruding retractable locking elements disposed between the plates.

4. A locking assembly for an electric meter clamping ring assembly of the type comprising a U-section split ring having outwardly turned substantially parallel ends and a clamping bolt drawing said ends together, comprising a hollow housing having an aperture in the front face and means associated therewith for receiving a lock bolt of the type having extendable locking elements at one end and an aperture at the other end for receiving an operating tool, said means associated with the aperture maintaining said lock bolt perpendicular to the plane of the ring and in a position such that the operating mechanism of the bolt is acessible from the front of the housing, means in the housing receiving the front end of the lock bolt in locking engagement, said means being attached to the clamping ring assembly as to prevent removal of the housing when the lock bolt is in the assembled position.

5. A locking assembly for use with an electric meter clamping ring of the type having outwardly turned adjacent ends with inturned side edges, said ends being drawn together by a bolt or the like, said assembly comprising a housing, a U-shaped member for hanging over the bolt, said U-shaped member having legs with an upper portion dimensioned to be disposed between the ends of the clamping ring and end portions disposed below the ends of the clamping ring, said end portions and the front of the housing having aligned apertures to receive a lock bolt of the type having radially projectable locking means, the components being so dimensioned that when the bolt is fully inserted into the housing, the locking means is positioned behind an end portion of the U-shaped member.

* * * * *